United States Patent [19]

Nolan et al.

[11] Patent Number: 5,223,110
[45] Date of Patent: Jun. 29, 1993

[54] APPARATUS FOR ELECTROPLATING ELECTRICAL CONTACTS

[75] Inventors: Ernest R. Nolan, Round Rock; Charles W. C. Lin, San Antonio, both of Tex.

[73] Assignee: Microelectronics and Computer Technology Corporation, Austin, Tex.

[21] Appl. No.: 805,131

[22] Filed: Dec. 11, 1991

[51] Int. Cl.⁵ .............................................. C25D 17/00
[52] U.S. Cl. .................................................. 204/224 R
[58] Field of Search ..................................... 204/224 R

[56] References Cited

U.S. PATENT DOCUMENTS 5,032,234 7/1991 Oku ...................................... 205/125

OTHER PUBLICATIONS

"Hunter Mini-Plating Pens Ultra-Compact Electro Plating System With Marker Pen Convenience," Hunter Products, Inc. Bridgewater, NJ, pp. 1-4.
"Enthone-OMI SEL-REX," ENTHONE-OMI, INC., New Haven, Conn., Mar. 1987, pp. 1-8.
"Carousel Data 35/22," S. G. OWEN LTD., Philadelphia, Pa., pp. 1-2.
"Flip-Top Data 35/25", S. G. OWEN LTD., Philadelphia, Pa. pp. 1-2.
"Mini-Lab Data 34/23," S. G. Owen Ltd., Philadelphis, Pa., pp. 1-2.

Primary Examiner—T. M. Tufariello
Attorney, Agent, or Firm—Fulbright & Jaworski

[57] ABSTRACT

A method and apparatus for selectively electroplating a metallic coating, such as solder, onto a plurality of small and closely spaced electrical contacts. The method includes sealingly enclosing the contacts in an electroplating cell having an anode, a cathode and a chamber, forming an electrical connection between the cathode and the contacts and electroplating the contacts.

15 Claims, 3 Drawing Sheets

APPARATUS FOR ELECTROPLATING ELECTRICAL CONTACTS

BACKGROUND OF THE INVENTION

The present invention is directed to a method and apparatus for electroplating a metallic coating, such as solder to an array of small, olosely spaced electrical contacts or pads.

When an electronic component fails it often becomes economically necessary to remove the failed device rather than replace the entire assembly. In the case where the electronic component such as an integrated circuit has electrical leads which are solder bonded they can be easily removed by remelting the soldered connections and removing the defective components such as disclosed in U.S. Pat. No. 4,934,582. However, after removal of the defective integrated circuit and prior to bonding a replacement integrated circuit, it is necessary to replenish the solder on the substrate pads which are small and which are closely spaced together. For example, the pads are three or four mils wide and are spaced on less than 15 mil centers. In addition, there are other applications in microelectronic assemblies where it is desirable to add a coating such as solder to substrate pads after the substrate fabrication process is complete. For example, it is desirable to pre-tin pads on a substrate when normal rack plating of solder is not feasible.

In some cases, the substrate may already be partially populated with electronic components or have surface plating other than solder in some areas. In these cases a solder replenishment method which requires immersion in molten solder or heating of the board or assembly to solder melting temperatures may be unacceptable. In many cases, the geometry of the pads may be too small for addition of solder by means of wire soldering and soldering iron, or even dispensing of solder cream and subsequent reflow. And in other cases, prior to soldering, certain metallic coatings must be removed in order to make a satisfactory solder joint.

The present invention is directed to a method of selectively electroplating a metallic coating onto a plurality of closely spaced electrical contacts by providing a miniaturized electroplating cell which encompasses only the desired area containing the electrical contacts to be plated and provides a bussing structure to connect all of the electrical contacts needing electrical coating while protecting the rest of the assembly from unwanted contact with the electroplating chemicals.

SUMMARY OF THE INVENTION

The present invention is directed to a method of selectively electroplating a metallic coating onto a plurality of closely spaced electrical contacts and includes sealingly enclosing the contacts in an electroplating cell having an anode, a cathode and a chamber for receiving an electroplating solution, forming an electrical connection between the cathode and the electrical contacts, and electroplating a coating onto the contacts by a flow of electrical current between the anode and the cathode and through an electroplating solution.

A still further object of the present invention is electrically connecting all of the electrical contacts together in electrical parallel circuit with a high electrically resistive cathode thereby minimizing the impact of contact resistance variation from electrical contact to electrical contact on the plating height uniformity.

Yet a still further Object is that priOr to electroplating an etching solution is flowed through the chamber for etching the electrical contacts for removing undesired material prior to electroplating.

A further object of the present invention is the provision of a method of selectively electroplating solder onto a plurality of small closely spaced electrical pads on a substrate by sealingly engaging the substrate and enclosing the pads in an electroplating cell having an anode, a cathode and a chamber for reCeiving electroplating solder solution. The sealing of the cell to the substrate prevents unwanted contact between the electroplating solution and surrounding areas of the substrate. The method further includes forming an electrical connection between the cathode and the pads, adding an electroplating solution to the chamber and between the anode and pads, and supplying electrical current between the anode and cathode for electroplating solder onto the pads. Preferably the cathode is insulated from the anode for directing the current flow to the pads.

Still a further object of the present invention is the provision of an electroplating cell for electroplating an metallic coating onto a plurality of closely spaced electrical contacts including a housing having a chamber with a side exposed to the outside of the housing wherein the chamber is adapted to enclose the electrical contacts. Resilient seal means are connected to the housing and surround the exposed side for sealing around the contacts. An anode is provided in the chamber and a cathode is connected to the housing for electrically contacting a plurality of contacts. An inlet and outlet port are provided in fluid communication with the chamber for admitting and expelling fluid from the chamber.

Yet a still further object is wherein the resilient seal and the cathode include a carbon filled elastomeric connection which provides a seal and cathode that will compensate for small non-uniformities in the height of the pads or substrate. Preferably insulator means are provided between the anode and cathode for directing the electroplating current to the electrical contacts.

Yet a further object of the present invention is wherein the seal means include first and second space concentrically positioned seal means for isolating the electrical contacts from other components.

Another feature of the present invention is wherein the anode extends across but is spaced from the plurality of contacts for supplying a uniform current flow to the electrical contacts.

A still further object of the present invention is the provision of an electroplating Cell for electroplating solder onto a plurality of small closely spaced electrical pads on a substrate which includes a housing having a chamber exposed to the outside of the housing in which the chamber is adapted to enclose the pads when the housing engages the substrate, inner and outer concentrically spaced resilient seal means connected to the housing and surrounding the exposed chamber for sealing around the pads when the housing engages the substrates. One of the seal means include a carbon filled elastomeric connection positioned to engage a plurality of pads and act as a cathode. A tin lead anode is positioned in the chamber, and an inlet and outlet port is provided in fluid communication with the chamber for admitting and expelling fluid from the chamber.

Yet a still further object is the provision of a cell for etching and electroplating solder onto a plurality of outer lead fingers of a tape automated bonding tape which includes a resilient and electrically non-conductive housing for sealingly engaging the fingers wherein the housing includes a chamber for enclosing a portion of the outer lead fingers. An anode is positioned in the chamber and a cathode is positioned outside of the chamber for contacting a plurality of outer lead fingers. An electrical supply is connected between the anode and cathode and an inlet and outlet port are provided in fluid communication with the chamber for admitting and expelling etching solution and electroplating solution to and from the chamber.

Other and further objects, features, and advantages will be apparent from the following description of presently preferred embodiments of the invention, 9iven for the purpose of disclosure and taken in conjunction with the accompanying drawings.

DESCRIPTION OF THE PREFERRED EMBODIMENTS

The present invention will be described in connection with a method and apparatus for replenishing the solder on the outer lead bonding pads after removal of a defective integrated circuit and prior to bonding the replacement, for purposes of illustration only. However, the present invention may also be used for electroplating any metal or alloy that can be electroplated such aS copper, tin or gold onto a variety of electrical contacts.

Figure 1:
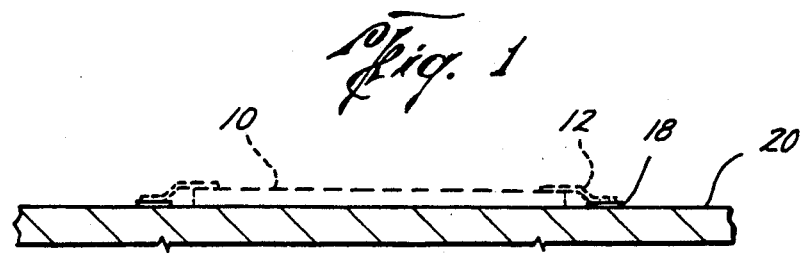
FIG. 1 is an elevational fragmentary schematic view illustrating the removal of an electronic component such as an integrated circuit and separating its connected outer leads from a welded bond on a substrate.

Referring now to the drawings, and particularly FIG. 1, an electronic component 10 shown in dotted outline such as an integrated circuit chip, has a plurality of leads 12, which may be tape automated bonded (TAB) tape leads. The inner leads are bonded to the component 10 and the outer leads are bonded to electrical contacts such as pads or bumps 18 such as by a solder connection.

If electronic component 10 is defective it is removed by separating the leads 12 from the pads 18 by any suitable means such as described in U.S. Pat. No. 4,934,582. However, the solder on the pads 18 must be replenished prior to bonding a replacement component 10 thereon. This is difficult to accomplish with conventional solder techniques because the array of pads 18 are both small and closely spaced.

Figure 2:
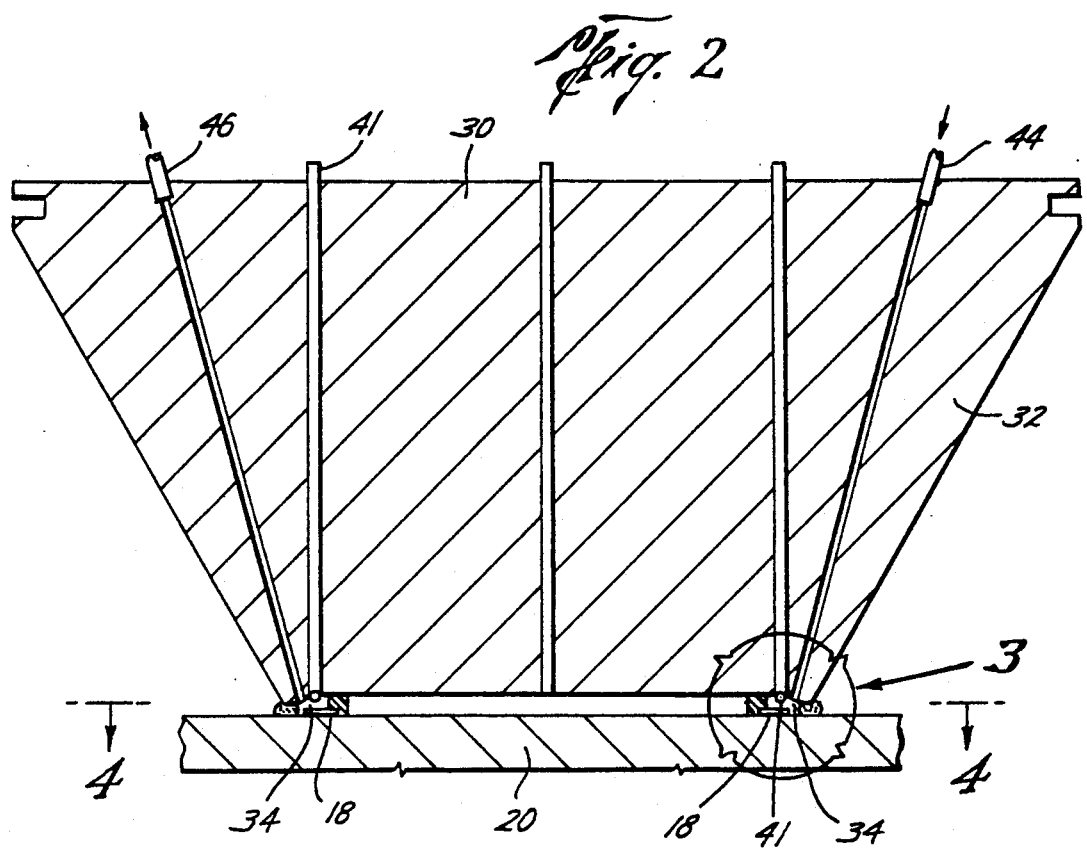
FIG. 2 is an enlarged cross sectional view of an electroplating cell of the present invention in position for electroplating pads on an electrical substrate.
Figure 3:
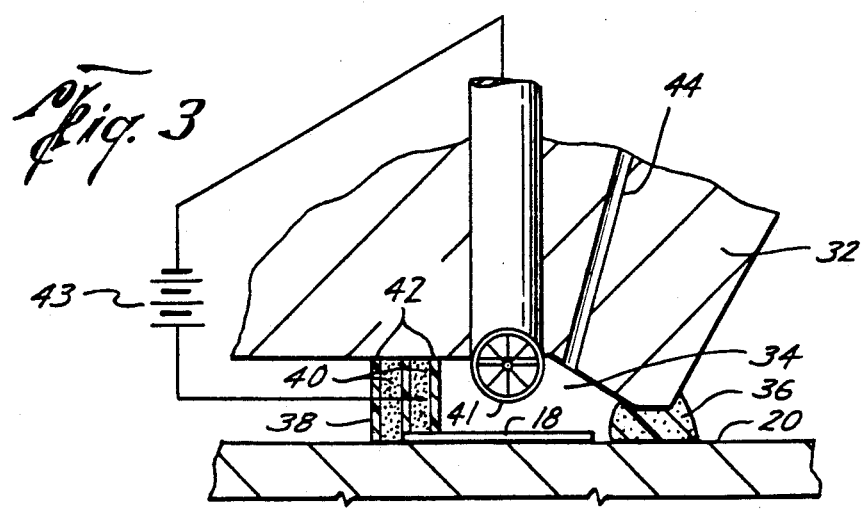
FIG. 3 is an enlarged fragmentary cross sectional view of the section 3 of FIG. 2.
Figure 4:
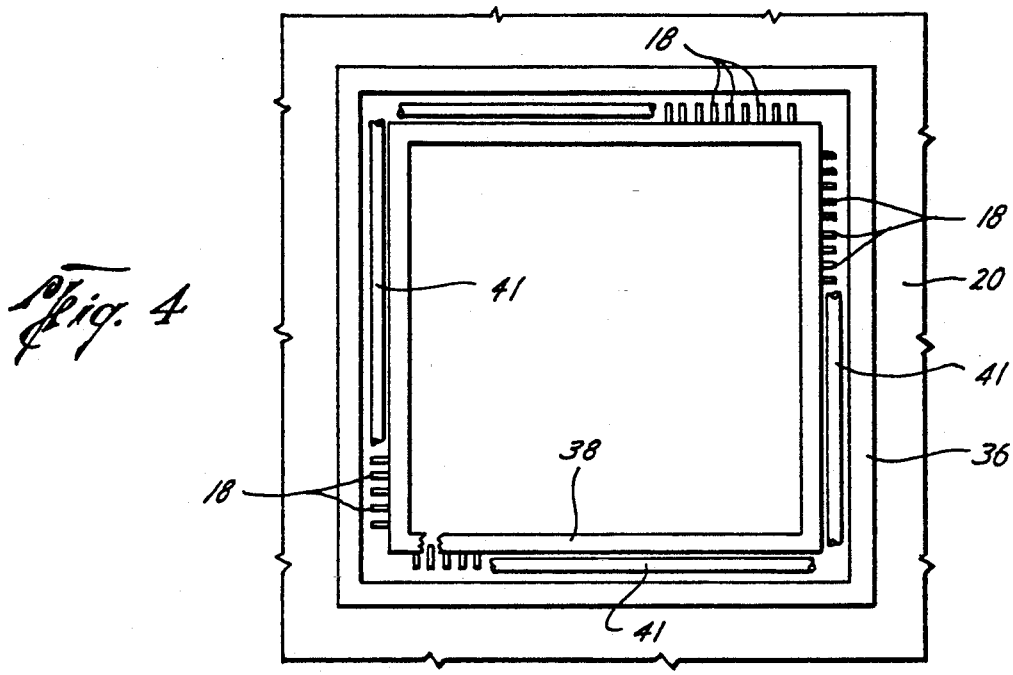
FIG. 4 is a cross sectional view taken along the line 4—4 of FIG. 2, FIG: 5A and FIG. 5B are fragmentary cross sectional views of another embodiment of the present invention for etching and plating a portion of the outer leads of a TAB tape with FIG. 5B having a slightly different backup mechanism.

Referring now to FIGS. 2, 3 and 4, a plating cell generally indicated by the reference 30 is provided which includes a housing 32 having a chamber 34 having a side exposed to the outside of the housing 32. When the housing 32 engages the substrate 20 the chamber 34 is adapted to enclose the pads or contacts 18. Resilient seal means are connected to the housing 32 and surround the exposed side of the chamber 34 so as to seal against the substrate 20 and enclose the contacts 18 within the chamber 34. As the chamber 34 is to be filled with an electroplating chemical it is important to protect the rest of the substrate 20 from unwanted contact from the electroplating chemicals. While a single seal could be used to enclose all of the rows of pads 18 to be plated, it is preferable to use a first seal 36 and a second concentrically spaced seal 38 which enclose only the rows of pads 18 without the electroplating chemicals contacting the remainder of the substrate 20. The seal 36 may be any suitable resilient elastomer type seal which will conform to any surface irregularities between the housing 32 and the substrate 20. While the seal 38 may be a similar seal, it is preferred that the seal 38 be a carbon filled elastomeric connector 38 consisting of carbon impregnated layers 40 of silicone which are separated by electrically non-conductive silicone layers 42. Such connectors may be obtained from Elastomeric Technologies, Inc. The carbon filled elastomeric connector 38 serves several functions. First, it serves as a seal between the housing 32 and the substrate 20. Secondly, the connector 38 serves as a cathode to provide a bussing connection to connect all of the pads 18 needing solder replenishment. Thus, the cathode function of the connector 38 electrically connects all of the electrical pads 18 together in electrical parallel. Since the electrical resistance of the carbon filled connector 38 is large, this resistive nature helps to maintain even plating thickness of the pads 18. That is, the contact resistance between the connector 38 and each of the individual pads 18 may vary. In order obtain a more uniform flow of electricity between the pads 18 and the connector 38 the large resistance of the carbon connector 38 overshadows the variation in the contact resistance with the pads 18 and thereby insures an even plating thickness from pad to pad.

The plating cell 30 includes an anode 41 in the body 32 connected by a suitable electric power of supply 43. The cathode connector 38 is also connected to the power supply 43. It is to be noted, as best seen in FIG. 4, that the anode 41 is spaced over but extends across all of the pads 18 for providing an even distribution of electroplating current to all the pads 18.

In addition, the housing 32 of the cell 30 includes a fluid inlet 44 and a fluid outlet 46 for transmitting fluid to and from the enclosed chamber 34. In the case of solder replenishment, the anode 41 is preferably constructed of tin-lead solder and extends evenly across all of the pads 18.

Figure 8:
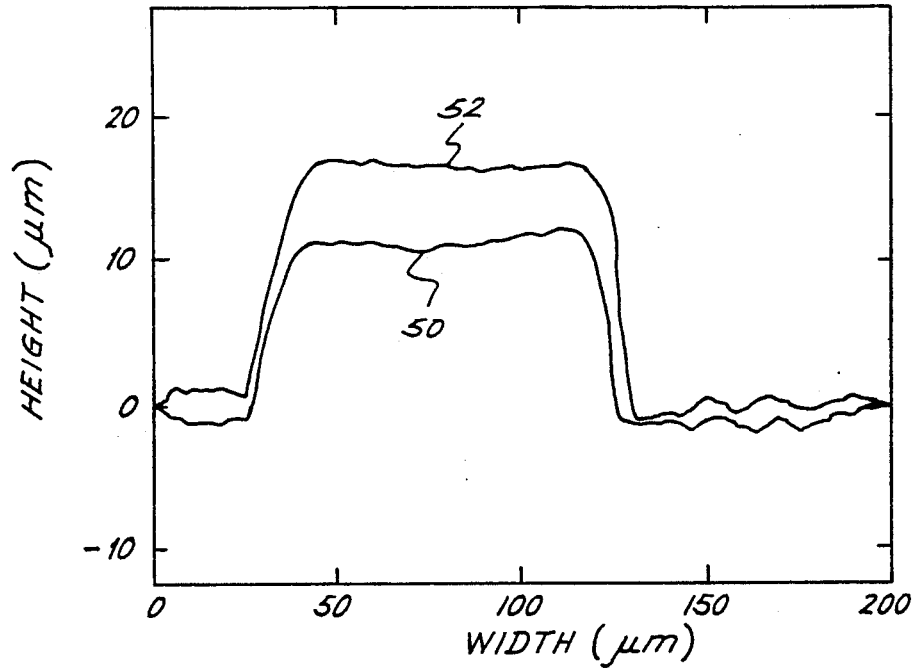
FIG. 8 is a graph illustrating the addition of solder to a pad using the electroplating method of th ⓡpresent invention.

In use, the electroplating cell 30 sealingly engages the substrate 20 by the seals 36 and 38 while the seal connector 38 makes a bussing contact with the pads 18. While any suitable tin-lead electroplating solution may be used, the preferred process plates a 60/40 tin-lead onto the copper surfaces of the pads 18 by using a Solderex (trademark) LPC makeup solution which contains tin-lead and fluoboric acid. In addition, a 5% by volume of Solderex LPC starter solution is provided for general electroplating using the cell SEL-REX (trademark) Solderex LPC solder plating process with a Current power supply. The plating solution may be inserted into the Chamber 34 through the inlet 44 and after use is removed through the outlet 46 by a suitable vacuum. After electroplating, it is desirable to flush out the chamber 34 with DI water. Using a prototype plating cell, the results of an experiment shown in the graph in FIG. 8 indicate the difference in the height of a pad before plating 50 and after plating 52.

In replacing an electronic component or integrated circuit 10 with outer leads and soldering them to the pads 18 other steps may be required. For example, if the outer leads are gold plated copper it is desirable to etch the gold off as gold is not a desirable material for a tin-lead solder joint. Therefore, the outer leads of the electrical component 10 should be etched to remove the gold and replace the gold with tin. The etching solution may be potassium iodate/iodine, which also etches a tin or tin-lead anode, but since the anode is much thicker than the gold plating to be r3emoved the anode will normally survfive many cycles before needing to be repalced. The etching solution may also be Fe(CN$^{3-}$$_6$/KCN/KOH which selectively removes gold without grossly attacking a tin or tin-lead anode.

Figures 5A, 5B:
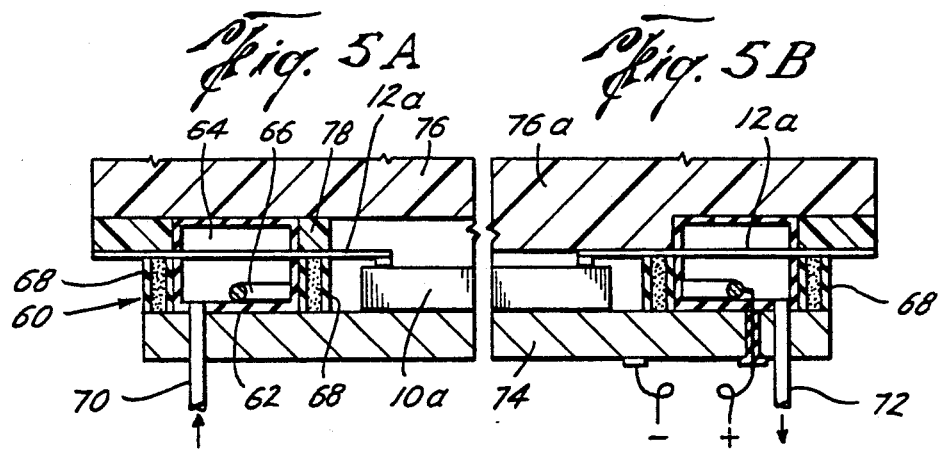
Figure 6:
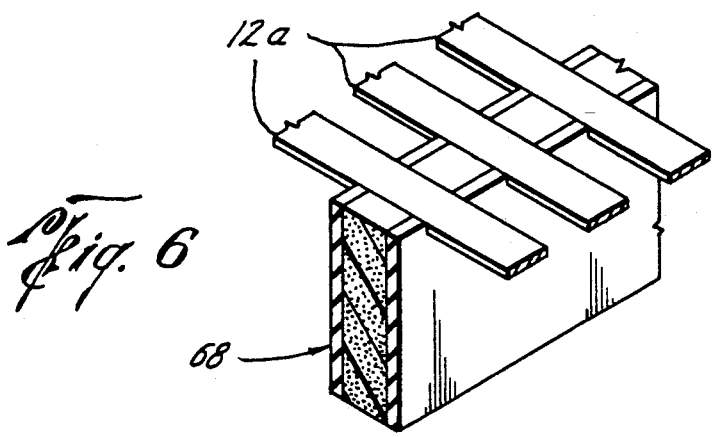
FIG. 6 is an enlarged fragmentary prospective view of the engagement of the cathode of FIGS. 5A and 5B engaging the outer lead fingers of the TAB tape.

Referring now to FIGS. 5A and 5B another embodiment of the present invnetion is shown in which the outer leads 12a of a repalcement electrical component 10a are to be etched and electroplated prior to the leads 12a being bonded to the pads 18. In this emboidment the cell 60 for etching and electroplating soldr onto a pluraiyt of outer lead fingers 12a as best seen which includes a resilient and electrically non-condictive housing 62 for sealingly engaging the fingers 12a. The hosuing 62 includes a chamber 64 for enclosing a portion of the outer lead fingers 12a. The distal end ofthe fingers 12a need not be etched and electroplated as it is cut off and removed prior to bonding the fingers 12a to the pads 18. An anode 66 is provided in the chamber 64 and a cathode 68 is proivded outside the chamber for contacting a plurality of outer lead fingers 12a. The cathode 68, also shown in FIG. 6 sealing and electrically engagin a plurailty of fingers 12a may be similar to carbon filled elastomeric connector 38 available from Elastomer Technologies, Inc. The seailng cathode 68 may be proivded on opposite sides of the hosuing 62. A fluid inlet port 70 is provided in the chamber 64 and a fluid outlet port 72 is proivided connected to the chamber 64. The electrical power supply is conencted between the anode 66 and a base 74 which is electrically connected to the cathodes 68. The only difference between FIGS. 5A and 5B is that abackup plate 76 is provided in FIG. 5A having top seals 78 whereas the backup plate 76A and FIG. 5B is used without a saeal.

Figure 7:
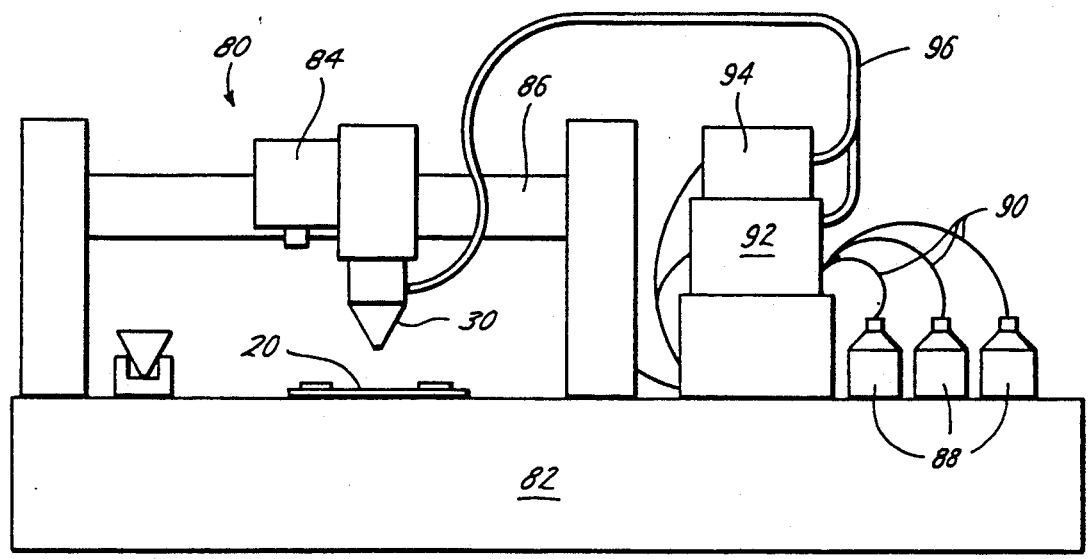
FIG. 7 is an elevational schematic view of an automatic electroplating system using the plating cell of FIG. 2.

Referring now to FIG. 7, if dsired, the plating and/or etching cells of the pesetnin nveiotn can be automated. Thus, the automated system genrelaly indicated by te refernece 80 includes a stag 82 for holding the substrate 20 and inclues a positioning camera 84 for target acquisition of fiduciary lines on the substrate 20 for accurately positioning the cell 30 at the desired location. A support structure 86 carries the electroplating cell 30 and camera 84 for properly positioning the cell in relatinship to the substrate 20 and in alignment therwith. The support system 86 is capable of moving the plating cell 30, and applying the proper pressure to compress the seals. Suitable container 88 are provided ocnatiing the necesary rpocess soltuion and waste reservoirs for performing the etching and electroplating processes and they are connected by lines 90 to a valve module 92. A pwoer supply 94 supplies the necessary electroplating curent thorugh line 96 which includes electricl and fluid lines to the cell 30.

The present invention, therefore, is well adapted to carry out the ojects and attain the ends and advantages mentioned as well as others inherent therein. While presently preferred emboimdnets of the invnetion have been given for the purpose of disclosure, numerous changes in the details of construction, arrangement of parts, and steps of the process will be readily apparent to those skilled in the art and which are encompassed within the spirit of the ivnention and the scope of the appended claims.

What is claimed is:

1. An electroplating cell for elecropalting a metallic coating onto a plurality of closely spaced electrical contacts, comprising:
   a housing including a chambr having a side exposed to the outside of the housing, said chamber adapted to enclose the electrical contacts,
   resilient seal means connected to teh housing and surrounding the exposed side for sealing around the ocntacts,
   an anode in teh camber,
   a cathode ocnnected to the resilient seal measn for electrically contacting a plurlaiy of contacts, and
   an inlet and an outlet port in fluid communiation with the camber for admitting and expeelling fluid from teh chabmer.

2. The apparatus of claim 1 wherein the resilient seal means and the cathode include a carbon filled elastomeric connection.

3. The apparatus of cliam 1 including, insulator measn between the anode and cathode.

4. The apparatus of claim 1 wherein the resiient seal means includes first and second concentrically positioned seal means.

5. The apparatus of claim 1 wherein the anode extends across, but spaced from, the plurality of contacts.

6. The apparatus of claim 1 wherein the cathode is resilient for compensating for non-uniformities in the height of the contacts.

7. An electroplating cell for electroplating solder onto a plurality of small closely spaced electrical pads on a substrate, comprising:
   a housing including a chamber exposed to the outside of the housing, said chamber adapted to enclose the pads when the housing engages the substrate,
   inner and outer concentrically spaced resilient seal means connected to the housing and surrounding the exposed chamber for sealing around the pads when the housing engages the substrate, one of said seal means including a carbon filled elastomeric connection positioned to engage a plurality of pads and act as a cathode,
   a tin-lead anode positioned in the chamber, and
   an inlet and outlet port in fluid communication with the chamber for admitting and expelling fluid from the chamber.

8. A cell for etching and electroplating solder onto a plurality of outer lead fingers of a tape automated bonded tape, comprising:
   a resilient and electrically non-conductive housing for sealingly engaging the fingers, said housing including a chamber for enclosing a portion of the outer lead fingers, an anode positioned in the chamber, a cathode positioned outside the chamber for contacting a plurality of outer lead fingers, an electrical supply connected between the anode and cathode, and an inlet and outlet port in fluid communication with the chamber for admitting and expelling etching solution and electroplating solution to and from the chamber.

9. The apparatus of claim 1 wherien the resilient seal means and the cathode include an elastomeric connection.

10. The apparatus of claim 1 wherein the cathode has high resistance for overshadowing the variation in contact resistance between the cathode and the contacts.

11. An electroplating cell for electroplating a metallic coating onto a plurality of closely spaced electrical contacs, comprsing:

a housing including a chamber having a side exposed to the outside of the hosuinhg, siad chamber adatped to enclose the electrical contacts, resilient seal means connected to teh hosuing and surrounding the exposed side for sealing around the contacts, an anodie in the chamber, a cathode connected to teh hosuing for electrically contacting the contacts wherein the cathode is sized and shaped for directly contacting the contadts and wherein the cathode has a high resistance for overshadowing the variation in ocnact resistance bewteen the cathode and the contacts, therby allowing the contacts to be elecroplated to an even thickness, and an inlet and an outlet port in fluid communication with the chamber for admitting and expeelling fluid from the chamber.

12. The apparatus of claim 11 wherein the cathode is sized and shaped to connect all the contacts together in electrical parallel.

13. The apparatus of claim 11 wherein teh resilient seal means and thecathode include an elastomeric material.

14. The apapratus of claim 13 wherin the elastomeric material is carbon filled.

15. The apparatus of claim 14 wherin teh carbon filled elastomeric material includes carbon impregbnated layres of silicone separated electrically by elecrically non-condcutive silicone layers.

* * * * *

UNITED STATES PATENT AND TRADEMARK OFFICE
CERTIFICATE OF CORRECTION

PATENT NO. : 5,223,110
DATED : June 29, 1993
INVENTOR(S) : Nolan, et al

It is certified that error appears in the above-indentified patent and that said Letters Patent is hereby corrected as shown below:

Column 1, line 8, delete "olosely" and insert -- closely --
Column 2, line 1, delete "Object" and insert -- object --
Column 2, line 1, delete "priOr" and insert -- prior --
Column 2, line 10, delete "reCeiving" and insert -- receiving --
Column 2, line 52, delete "Cell" and insert -- cell --
Column 3, line 15, delete "9iven" and insert -- given --
Column 3, line 43, delete "th*" and insert -- the --
Column 3, line 54, delete "aS" and insert -- as --

Column 5, line 3, delete "Cur-" and insert -- cur- --
Column 5, line 5, delete "Chamber" and insert -- chamber --
Column 5, line 22, delete "r3emoved" and insert -- removed --
Column 5, line 23, delete "survfive" and insert -- survive --
Column 5, line 24, delete "repalced" and insert -- replaced --
Column 5, line 25, in the first formula, close the parenthesis after "N"
Column 5, line 28, delete "invnetion" and insert -- invention --
Column 5, line 29, delete "repalcement" and insert -- replacement --
Column 5, line 31, delete "emboidment" and insert -- embodiment --
Column 5, lines 32-33, delete "pluraiyt" and insert -- plurality --
Column 5, line 35, delete "hosu-" and insert -- hous- --
Column 5, line 37, delete "ofthe" and insert -- of the --
Column 5, line 41, delete "proivded" and insert -- provided --
Column 5, line 44, delete "plurailty" and insert -- plurality --
Column 5, line 46, delete "seailng" and insert -- sealing --
Column 5, line 47, delete "proivded" and insert -- provided --
Column 5, line 47, delete "hosuing" and insert -- housing --

UNITED STATES PATENT AND TRADEMARK OFFICE
CERTIFICATE OF CORRECTION

PATENT NO. : 5,223,110

DATED : June 29, 1993

INVENTOR(S) : Nolan, et al

It is certified that error appears in the above-indentified patent and that said Letters Patent is hereby corrected as shown below:

Column 5, line 49, delete "proivided" and insert -- provided --
Column 5, line 50, delete ""conencted" and insert -- connected --
Column 5, line 53, delete "abackup" and insert -- a backup --
Column 5, line 56, delete "dsired" and insert -- desired --
Column 5, line 57, delete "pesetnin" and insert -- present --
Column 5, line 57, delete "nveiotn" and insert -- invention --
Column 5, line 58, delete "genrelaly" and insert -- generally --
Column 5, line 58, delete "te" and insert -- the --
Column 5, line 59, delete "refernece" and insert -- reference --
Column 5, line 59, delete "stag" and insert -- stage --
Column 5, lines 64-65, delete "relatinship" and insert -- relationship --
Column 5, line 65, delete "therwith" and insert -- therewith --
Column 5, line 68, delete "container" and insert -- containers --
Column 5, line 68, delete "ocnatiing" and insert -- containing --
Column 6, line 1, delete "necesary rpocess soltuion" and insert -- necessary process solution --
Column 6, line 4, delete "pwoer" and insert -- power --
Column 6, line 5, delete "thorugh" and insert -- through --
Column 6, line 5, delete "electricl" and insert -- electrical --
Column 6, line 8, delete "ojects" and insert -- objects --
Column 6, line 10, delete "emboimdnets" and insert -- embodiments --
Column 6, line 10, delete "invnetion" and insert -- invention --
Column 6, line 15, delete "ivnention" and insert -- invention --
Column 6, line 18, delete "electropalting" and insert -- electroplating --
Column 6, line 21, delete "chambr" and insert -- chamber --
Column 6, line 24, delete "teh" and insert -- the --
Column 6, line 26, delete "ocntacts" and insert -- contacts --

UNITED STATES PATENT AND TRADEMARK OFFICE
CERTIFICATE OF CORRECTION

PATENT NO. : 5,223,110  
DATED : June 29, 1993  
INVENTOR(S) : Nolan, et al

Page 3 of 4

It is certified that error appears in the above-indentified patent and that said Letters Patent is hereby corrected as shown below:

Column 6, line 27, delete "teh camber" and insert -- the chamber --
Column 6, line 28, delete "ocnnected" and insert -- connected --
Column 6, line 28, delete "measn" and insert -- means --
Column 6, line 29, delete "plurlaiy" and insert -- plurality --
Column 6, line 31, delete "camber" and insert -- chamber --
Column 6, line 32, delete "expeelling" and insert -- expelling --
Column 6, line 33, delete "teh chabmer" and insert -- the chamber --
Column 6, line 37, delete "cliam" and insert -- claim --
Column 6, line 37, delete "measn" and insert -- means --
Column 6, line 39, delete "resiient" and insert -- resilient --
Column 7, line 14, delete "wherien" and insert -- wherein --
Column 7, line 25, delete "contacs, comprsing" and insert --contacts comprising--
Column 7, line 27, delete "hosuinhg, siad" and insert -- housing, said --
Column 7, line 28, delete "adatped" and insert -- adapted --

UNITED STATES PATENT AND TRADEMARK OFFICE
CERTIFICATE OF CORRECTION

PATENT NO. : 5,223,110

DATED : June 29, 1993

INVENTOR(S) : Nolan, et al

It is certified that error appears in the above-indentified patent and that said Letters Patent is hereby corrected as shown below:

Column 8, line 1, delete "teh hosuing" and insert -- the housing --
Column 8, line 5, delete "teh hosuing" and insert -- the housing --
Column 8, lines 7-8, delete "contadts" and insert -- contacts --
Column 8, line 9, delete "ocnact" and insert -- contact --
Column 8, line 14, delete "expeelling" and insert -- expelling --
Column 8, line 19, delete "teh" and insert -- the --
Column 8, line 20, delete "thecathode" and insert -- the cathode --
Column 8, line 22, delete "apapratus" and insert -- apparatus --
Column 8, line 22, delete "wherin" and insert -- wherein --
Column 8, line 24, delete "teh" and insert -- the --
Column 8, line 25, delete "impregbnated" and insert -- impregnated --
Column 8, line 26, delete "layres" and insert -- layers --
Column 8, line 27, delete "non-condcutive" and insert -- non-conductive --

Signed and Sealed this

Twelfth Day of April, 1994

Attest:

*Attesting Officer*

BRUCE LEHMAN

*Commissioner of Patents and Trademarks*